United States Patent [19]

Yasaka et al.

[11] Patent Number: 5,047,825
[45] Date of Patent: Sep. 10, 1991

[54] SEMICONDUCTOR INTEGRATED CIRCUIT DEVICE HAVING A DECODER PORTION OF COMPLEMENTARY MISFETS EMPLOYING MULTI-LEVEL CONDUCTING LAYER AND A MEMORY CELL PORTION

[75] Inventors: Kazuo Yasaka, Kodaia; Yutaka Shinagawa, Iruma; Toru Miyamoto, Fuchuu, all of Japan

[73] Assignees: Hitachi, Ltd.; Hitachi Microcomputer Engineering, Ltd., both of Tokyo, Japan

[21] Appl. No.: 485,598

[22] Filed: Feb. 27, 1990

Related U.S. Application Data

[62] Division of Ser. No. 361,347, Jun. 5, 1989, Pat. No. 4,910,162.

[30] Foreign Application Priority Data

Jun. 9, 1988 [JP] Japan ................................ 63-142724

[51] Int. Cl.[5] ...................... H01L 27/02; H01L 27/10; H01L 23/48
[52] U.S. Cl. ......................................... 357/42; 357/41; 357/44; 357/45; 357/71
[58] Field of Search .................. 357/45, 42, 41, 45 M, 357/44, 71

[56] References Cited

U.S. PATENT DOCUMENTS 4,511,814  4/1985  Matsuo et al. ......................... 357/42
4,602,270  7/1986  Finegold et al. ...................... 357/45
4,780,753  10/1988 Ohkura et al. ........................ 357/45
4,855,803  8/1989  Aznmai et al. ........................ 357/45
4,928,164  5/1990  Tanizawa .............................. 357/45

FOREIGN PATENT DOCUMENTS 57-154869  9/1982  Japan ..................................... 357/42
62-104160  5/1987  Japan ..................................... 357/42

Primary Examiner—Andrew J. James
Assistant Examiner—Ngan Van Ngo
Attorney, Agent, or Firm—Antonelli, Terry, Stout & Kraus

[57] ABSTRACT

In a semiconductor integrated circuit device, such as a ROM having an instruction program set therein, in which an order for selecting word lines is variously different depending upon written information; a method of manufacture which can shorten a production process after the determination of the instruction program or the circuit arrangement of a decoder without adding to a manufacturing step is disclosed. Concretely, the method comprises the steps of providing selector switch elements which serve to select decode signal lines in accordance with address signals received from pairs of complementary address signal lines, each pair including a true line and a bar line, in a decoder forming region of a semiconductor substrate; providing a conductor film which is connected to input terminals of the selector switch elements and which is extended under regions for forming the true lines and the bar lines; providing an interlayer insulator film on the selector switch elements and the conductor film; forming contact holes in the interlayer insulator film on the conductor film so as to reach the conductor film; and connecting either of the true lines and the bar lines to the conductor film through the contact holes.

27 Claims, 14 Drawing Sheets

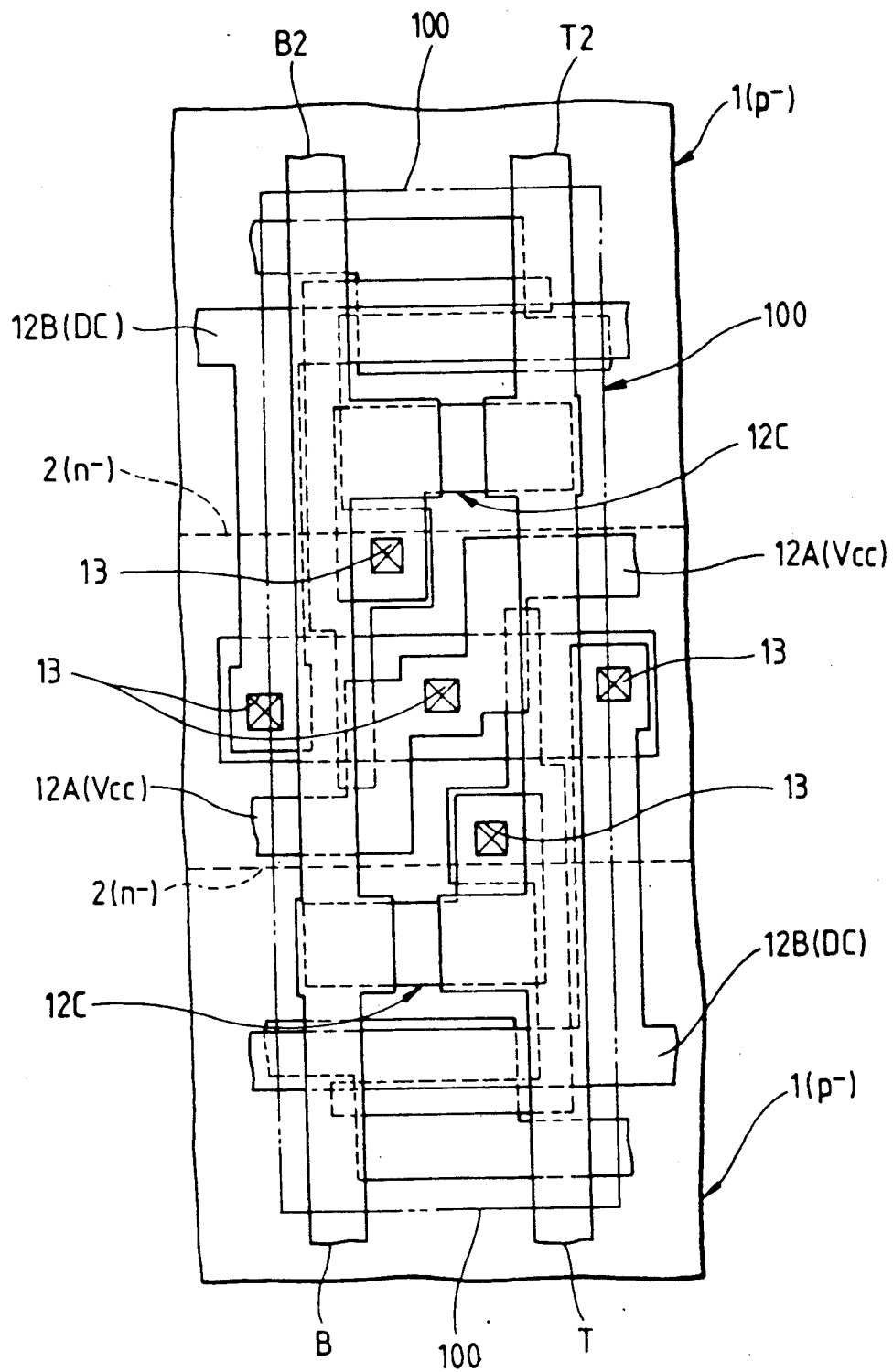

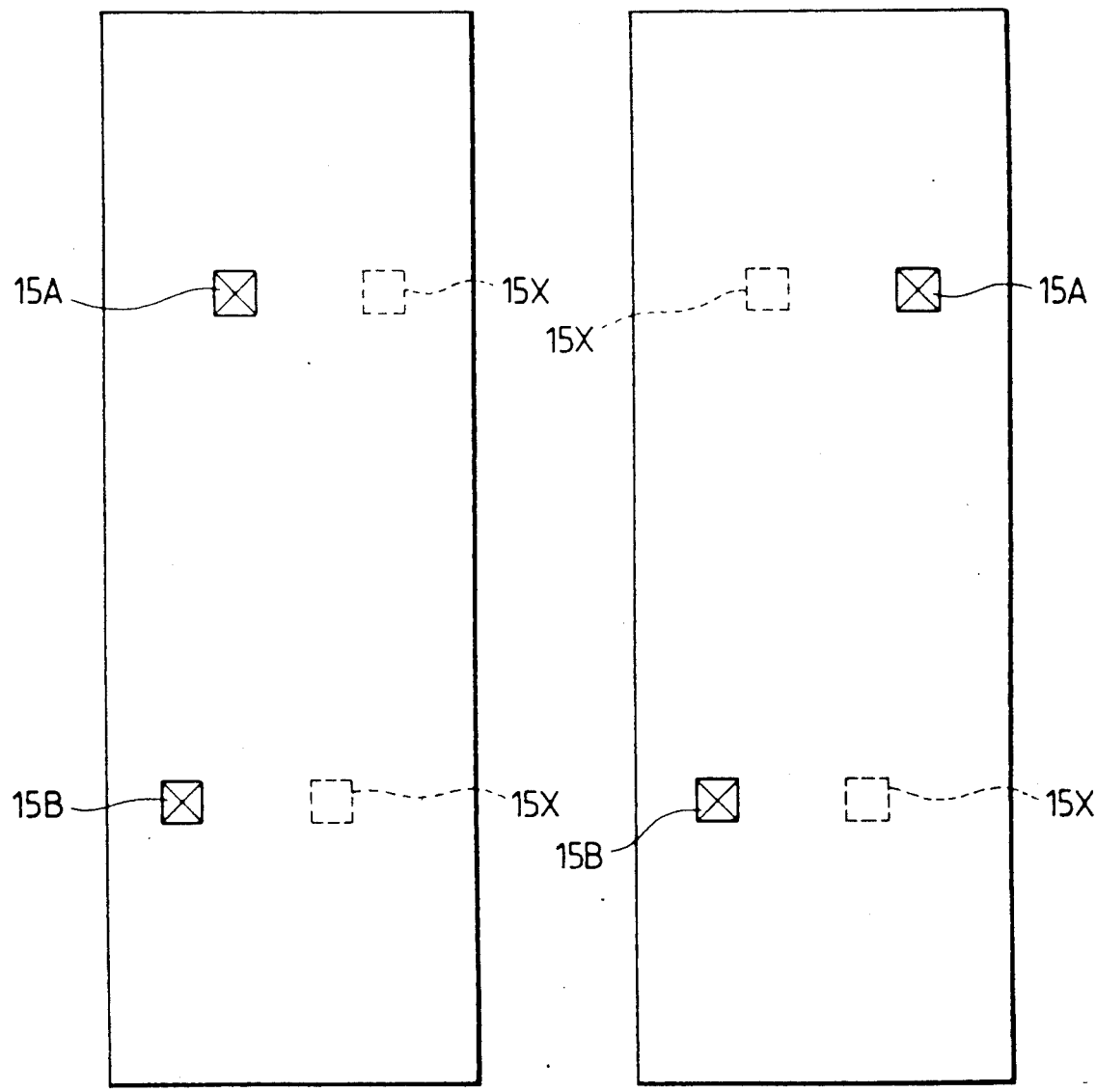

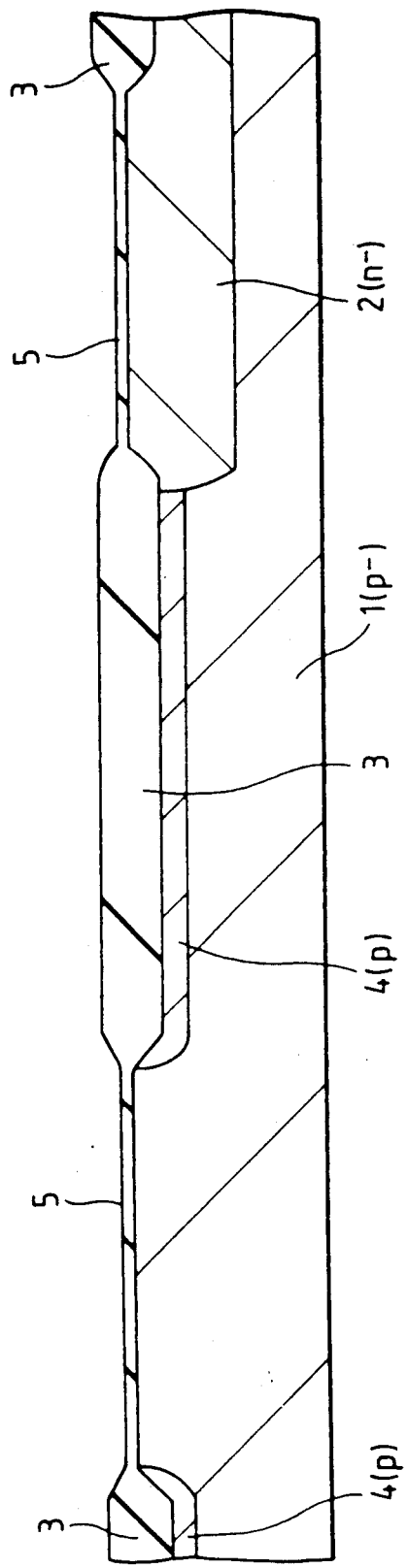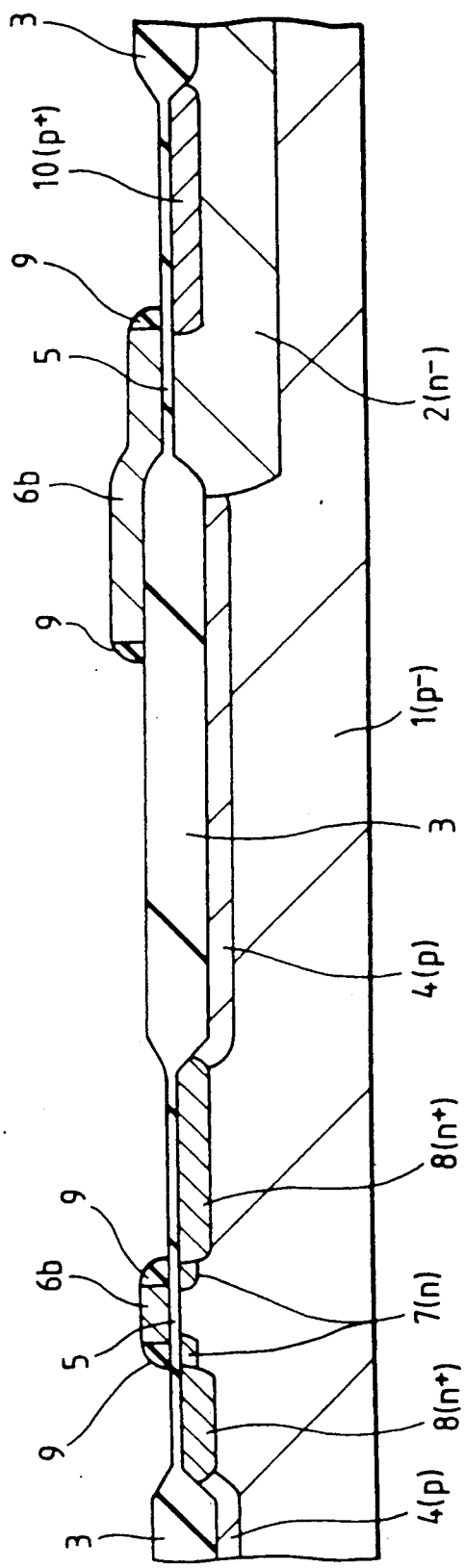

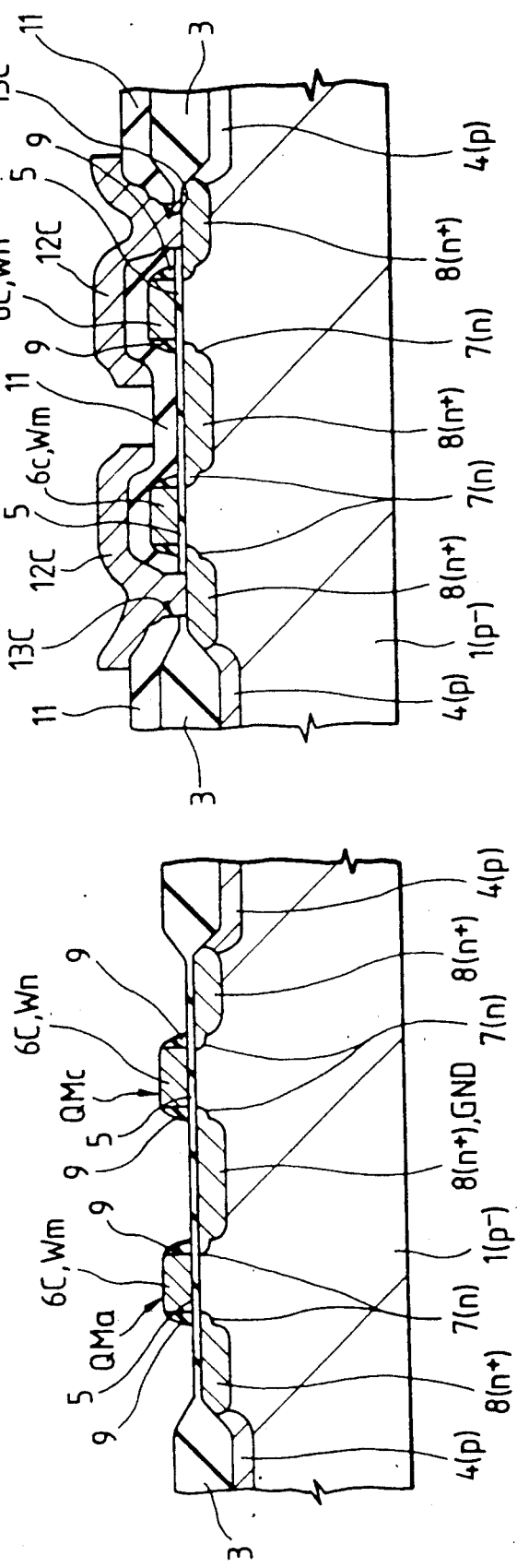

the information into the ROM till the completion of the semiconductor integrated circuit device is rather long. The reason for this is that a photolithographic step employing the mask for forming the n+-type diffused

SEMICONDUCTOR INTEGRATED CIRCUIT DEVICE HAVING A DECODER PORTION OF COMPLEMENTARY MISFETS EMPLOYING MULTI-LEVEL CONDUCTING LAYER AND A MEMORY CELL PORTION

This is a division of application Ser. No. 361,347, filed June 5, 1989, now U.S. Pat. No. 4,910,162, issued Mar. 20, 1990.

BACKGROUND OF THE INVENTION

The present invention relates to a semiconductor integrated circuit device, and more particularly to techniques which are effective when applied to the decoder of a read only memory (hereinbelow, abbreviated to "ROM").

One of peripheral LSIs (large-scale integrated circuits) is a graphic data processor (hereinbelow, abbreviated as "GDP") which processes graph data. An instruction program (microprogram) for operating the GDP is set in a microprogram storing ROM (hereinbelow, abbreviated to "micro ROM") which is built in the GDP.

Information is written into the memory cells of the micro ROM by, for example, the following system:

FIGS. 8A and 8B are a plan view and a circuit diagram of the essential portions of the memory cells for explaining the system, respectively. As shown in FIG. 8A, an n+-type diffused layer region DF is cut midway at each of the parts of the intersection point between a word line $WL_j$ made of polycrystalline silicon and a bit line $BL_j$ formed of an aluminum film and the intersection point between a similar word line $WL_{j+1}$ and a similar bit line $BL_{j+1}$. At this part, a thick oxide film LOC (field thermaloxidation film) lies directly under the word line, and in effect, no transistor is formed. The memory cells shown in FIG. 8A are depicted by the circuit diagram of FIG. 8B, in which only two transistors $Q_{m1}$ and $Q_{m2}$ are existent. In a case where the word line $WL_j$ and the bit line $BL_j$ have been selected, a current path from the bit line $BL_j$ to a ground potential GND is not established because of the absence of any transistor at the intersection point between the lines $WL_j$ and $BL_j$, so that the potential of the bit line $BL_j$ becomes a high level. In a case where the word line $WL_{j+1}$ and the bit line $BL_j$ have been selected, the transistor $Q_{m2}$ is turned "on" to establish the current path from the bit line $BL_j$ to the ground potential GND, so that the potential of the bit line $BL_j$ becomes a low level. As understood from FIG. 8A, a contact hole CONT for connecting the bit line and the diffused layer region is shared by two transistors constructing memory cells, so that the writing system is suited to a higher density of integration. Moreover, a mask and a diffusion step for forming the n+-type diffused layer regions can be shared by the formation of transistors constituting peripheral circuits, so that any special step for writing information into the ROM is not required. Accordingly, the system is also excellent in the production efficiency of a semiconductor integrated circuit device. A disadvantages of the system is that the period of time (TAT short for "turnaround time") required for the writing of layer regions is carried out at a comparatively early stage in an LSI production process.

On the other hand, information in the micro ROM is read out in such a way that address signals received from pairs of complementary address signal lines, each pair consisting of a true line T (e.g. a non-inverting signal line) and a bar line B (e.g. an inverting signal line), are decoded by a decoder, whereby a single word line is selected from among a large number of word lines.

By way of example, the decoder has its cell constructed of an inverter which is configured of a P-channel type MISFET and an N-channel type MISFET, and it has such cells arranged under the corresponding pairs of complementary address signal lines. The gate electrode of the inverter constructing the cell is connected to either the true line T or the bar line B. Here, in a case where the pairs of complementary address signal lines number 11 by way of example, the combinations of the connections of the gate electrodes that can be formed are 2048 in number and depend upon whether these gate electrodes of the inverters of the cells underlying the respective pairs of complementary address signal lines are connected to the true (non-inverting signal) lines or to the bar (inverting signal) lines.

Meanwhile, assuming by way of example that the instruction program has addresses-from Address 1 to Address 1000, the instruction data items of the micro ROM are not always read out in regular order as, for example from Address 1, Address 2, Address 3, ..., but they are read out at random as from Address 1 and then Address 500 or from Address 500 and then Address 100. This aspect differs for every instruction program. Consequently, the order in which the word lines are selected must be changed, so that the circuit arrangement of the decoder is changed. That is, those cells of the decoder whose gate electrodes are connected to the true lines T or to the bar lines B differ depending upon the instruction program. As an example of a measure for coping with this situation, in the micro ROM, the gate electrodes of the cells of the decoder are previously (preliminary) formed so as to extend to under regions where the true lines T are to be formed or regions where the bar lines B are to be formed, at the step of forming these gate electrodes. Thereafter, an interlayer insulator film is formed on the gate electrodes, contact holes are provided in the predetermined parts of the interlayer insulator film, and the true lines T and the bar lines B are formed on the interlayer insulator film including the contact holes. When the gate electrodes are extended to under the true lines T, these true lines are connected to them, and when the gate electrodes are extended to under the bar lines B, these bar lines are connected to them. Thus, the circuit arrangement of the decoder is determined by the step of forming the gate electrodes of the cells.

Although not known, an alternative method of determining the circuit arrangement of the decoder was studied by the inventor. More specifically, a P-channel type MISFET to be connected to the true line T and a P-channel type MISFET to be connected to the bar line B are previously (preliminary) formed separately from each other. Thereafter, one of the P-channel type MISFETs has its threshold voltage changed so as to be inoperable with an ordinary signal level. Thus, the cell of the decoder is configured of the other P-channel type MISFET and the N-channel type MISFET. The threshold voltage of the P-channel type MISFET to be rendered inoperable is changed in the following way: After, for example, the stage at which the interlayer insulator film, the contact holes and the pairs of complementary address signal lines have been formed, the parts of the interlayer insulator film overlying the gate electrodes of the P-channel type MISFETs to be rendered inoperable are selectively removed to form openings, thereby to expose the gate electrodes of these P-channel type MISFETs. Subsequently, an n-type impurity is introduced from the openings into the channel regions of the P-channel type MISFETs through the gate electrodes so as to change the threshold voltages of these MISFETs.

SUMMARY OF THE INVENTION

The inventors studied heightening the density of integration of the micro ROM and shortening the turn-around time (hereinbelow, abbreviated to "TAT") of the semiconductor integrated circuit device. As a result, the following fact has been revealed:

In the micro ROM, the area of the memory cell forming region thereof occupies a very large proportion on a semiconductor chip. For achieving the higher density of integration of the micro ROM, the system is favorable wherein, as stated before, the single contact hole for connecting the bit line and the diffused layer region to serve as the source or drain of the transistor constructing the memory cell is shared by the two transistors. However, the information (instruction program) of the micro ROM is determined by the manufacturing mask and diffusion step for forming the diffused layer regions. For this reason, in a case where any error has been developed in the information of the micro ROM by a defect involved at the design stage of the GDP or the production process thereof, the manufacture of the semiconductor integrated circuit device must be done over again from the step of forming the diffused layer regions in order to correct (rewrite) the information of the micro ROM, so that the TAT becomes longer.

Also, the inventors made studies on the method of the connection between each cell for constructing the circuit of the decoder of the micro ROM and the true line or bar line of the corresponding pair of complementary address signal lines. As a result, the following problems have been found out.

With the foregoing measure wherein the circuit arrangement of the decoder is determined by extending the gate electrodes of the P-channel type MISFETs for constituting the cells to the true lines T or the bar lines B, the gate electrodes are formed at the initial stage of the production process, which has incurred the problem that the number of steps required after the determination of the circuit arrangement of the decoder is as very large and as much as, for example, 64, so a long time is required till the completion of the semiconductor integrated circuit device. Moreover, when an error is discovered to be present in the circuit arrangement of the decoder or in the instruction program of the micro ROM, the production process must be done over again from the step of forming the gate electrodes of the MISFETs constitutive of the decoder circuit, for example as a debugging effort so that the period of time till the completion becomes very long.

In contrast, the method wherein the circuit arrangement of the decoder is determined by the ion implantation into the channel regions of the P-channel type MISFETs takes up a short processing time after the determination of the circuit arrangement, because the ion implantation is carried out after the formation of the pairs of complementary address signal lines.

As stated earlier, however, additional processing steps are required which include the step of forming the openings by removing those parts of the interlayer insulator film on the gate electrodes of the P-channel type MISFETs from which the ion implantation process is executed, followed by the step of implanting ions into the channel regions of the P-channel type MISFETs. This has incurred the problem that the number of steps from the first step of the production process of the semiconductor integrated circuit device having the mask ROM till the completion of the device increases.

The present invention has been made in order to solve the problems stated above, and it has for its object to provide in a semiconductor integrated circuit device, such as a ROM with an instruction program set therein (wherein an order for selecting word lines is variously different in conformity with written information techniques according to which a production process from the determination of the circuit arrangement of a decoder to the completion of the semiconductor integrated circuit device can be shortened without increasing the number of processing steps.

The above and other objects and novel features of the present invention will become apparent from the description of this specification when read with reference to the accompanying drawings.

A typical aspect of performance of the present invention is briefly summarized as follows:

A method of manufacturing a semiconductor integrated circuit device having a micro ROM, comprises the steps of:

(a) providing selector switch elements which serve to select decode signal lines in accordance with address signals received from pairs of complementary address signal lines, each pair including a true line and a bar line, in a decoder forming region of a semiconductor substrate;

(b) providing a conductor film which is connected to input terminals of said selector switch elements and which is extended under regions where said true lines and said bar lines are to be formed;

(c) providing an interlayer insulator film on said selector switch elements and said conductor film;

(d) forming contact holes in said interlayer insulator film on said conductor film so as to reach said conductor film; and (e) connecting either of said true lines and said bar lines to said conductor film through said contact holes.

According to the above method of manufacture, the conductor layer to be connected to the input terminals of the selector switch elements is provided under the regions where the true lines and the bar lines are to be formed, so that the circuit arrangement of a decoder is determined by the step of forming the contact holes for connecting the true lines or the bar lines. Therefore, a production process from the determination of the circuit arrangement of the decoder to the completion of the semiconductor integrated circuit device can be shortened without adding to any step.

BRIEF DESCRIPTION OF THE DRAWINGS

FIG. 6 is a plan view of the cells of the decoder for designing the layout of contact holes (15A, 15B) for connecting the gate electrodes (6a, 6b) of the cells and the true line or bar line thereof;

FIGS. 7a thru 7d are layout diagrams of the contact holes for connecting the cells of the decoder and the true line or bar line thereof;

FIGS. 13 thru 15 are sectional views for explaining a method of manufacturing redundant memory cells.

DESCRIPTION OF THE PREFERRED EMBODIMENTS

Now, embodiments of the present invention will be described with reference to the drawings.

Figure 1:
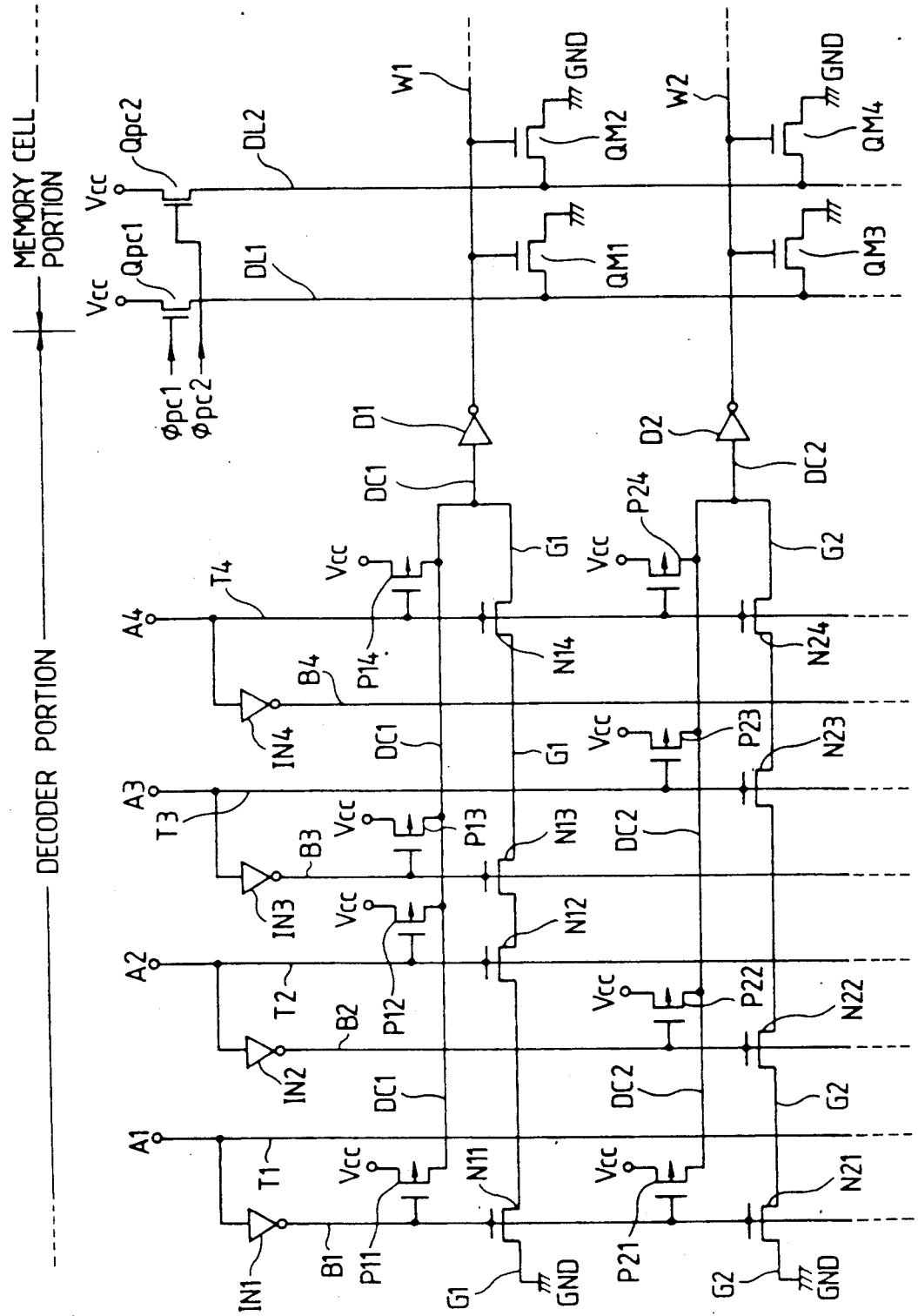
FIG. 1 is an equivalent circuit diagram for outlining the circuit arrangement of the decoder of a micro ROM which is included in a semiconductor integrated circuit device according to an embodiment of the present invention.
Figure 2:
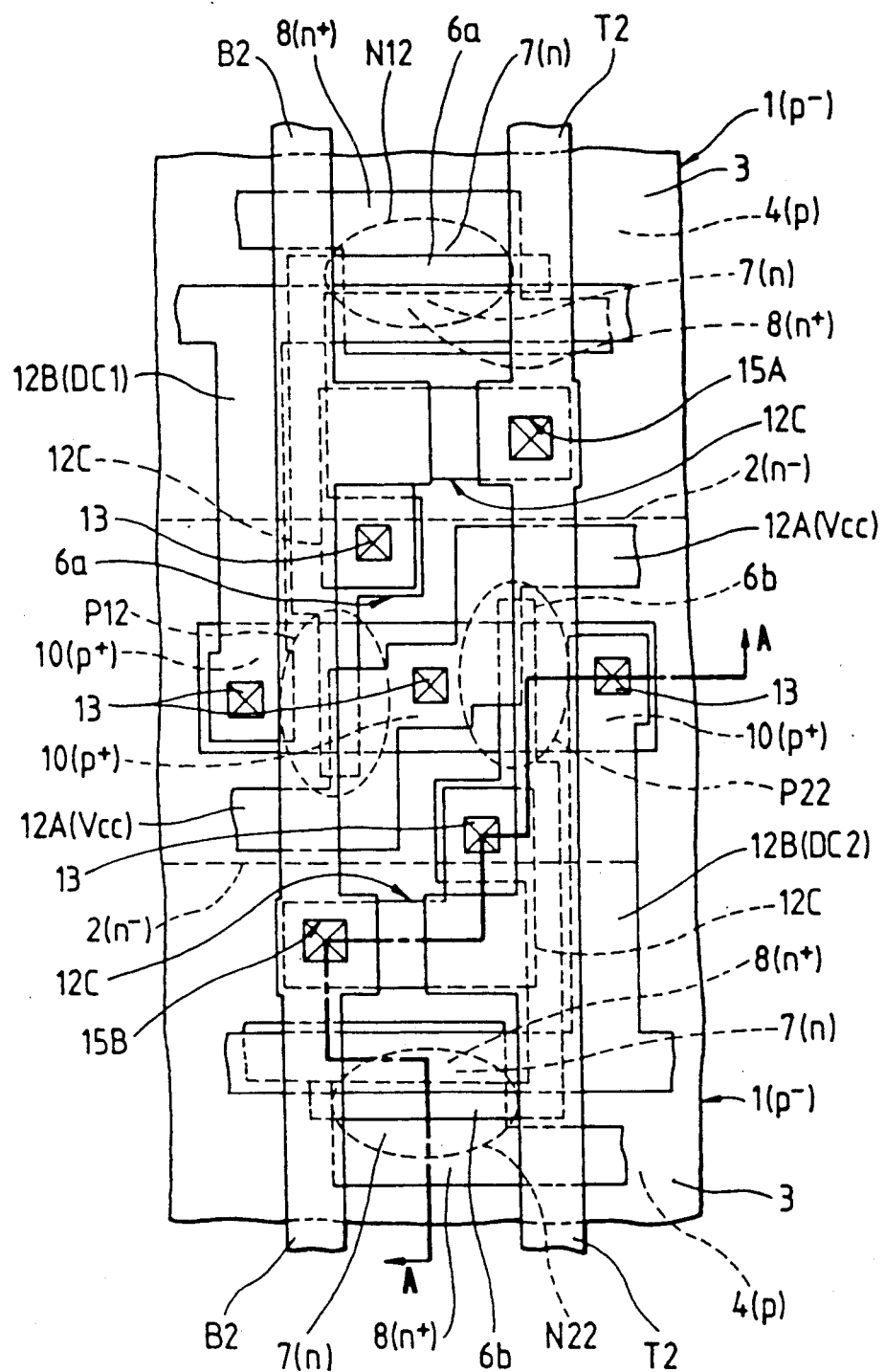
FIG. 2 is a plan view of the cells of the decoder shown in FIG. 1 constituting the circuit of the decoder.
Figure 3:
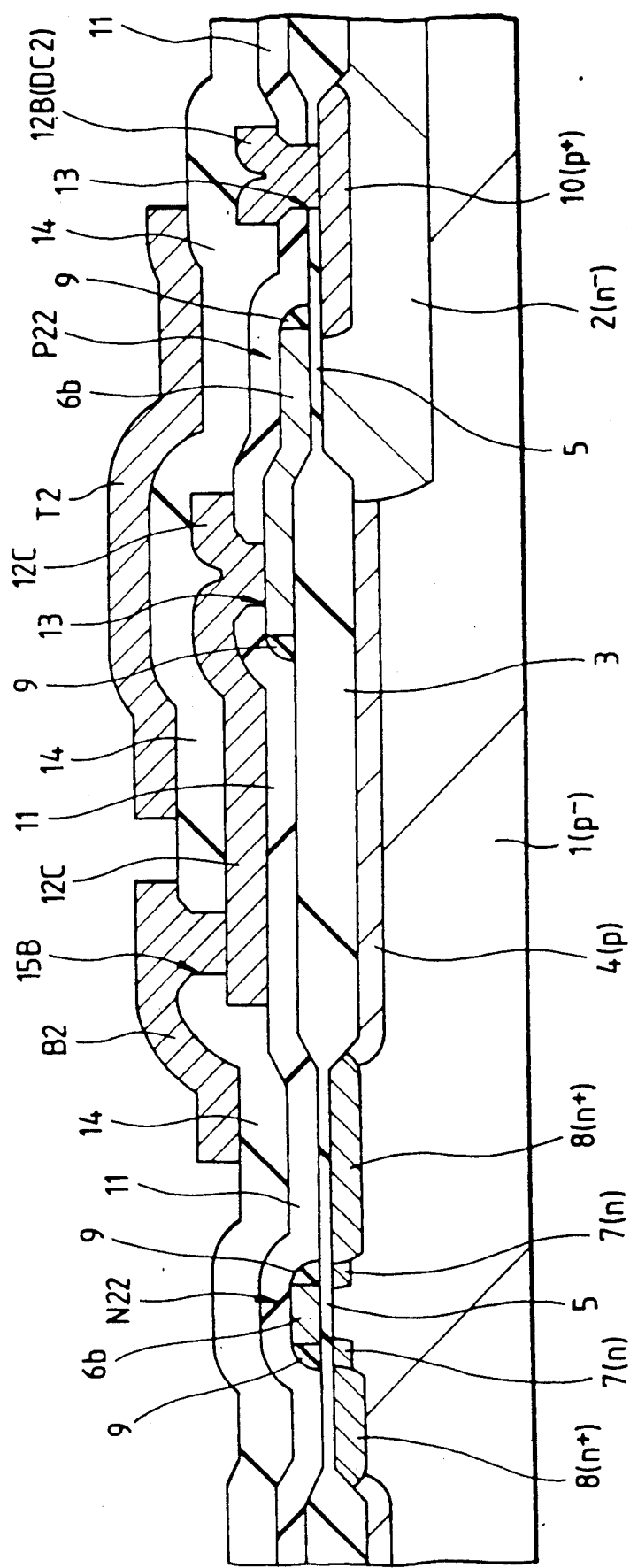
FIG. 3 is a sectional view taken along cutting-plane line A—A in FIG. 2.
Figure 4:
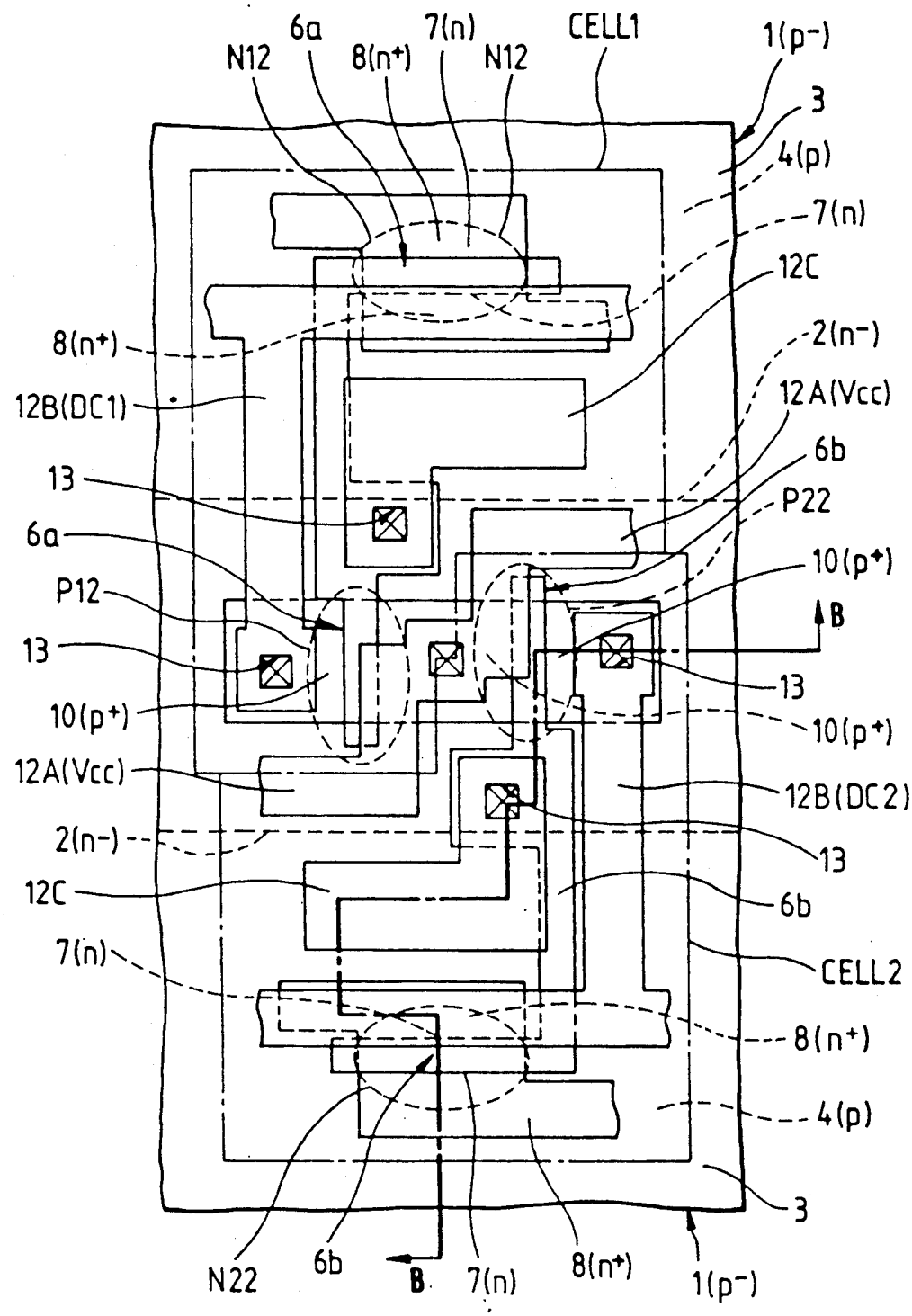
FIG. 4 is a plan view showing the cells of the decoder depicted in FIG. 2 with the pair of complementary address signal lines of the cells removed therefrom.
Figure 5:
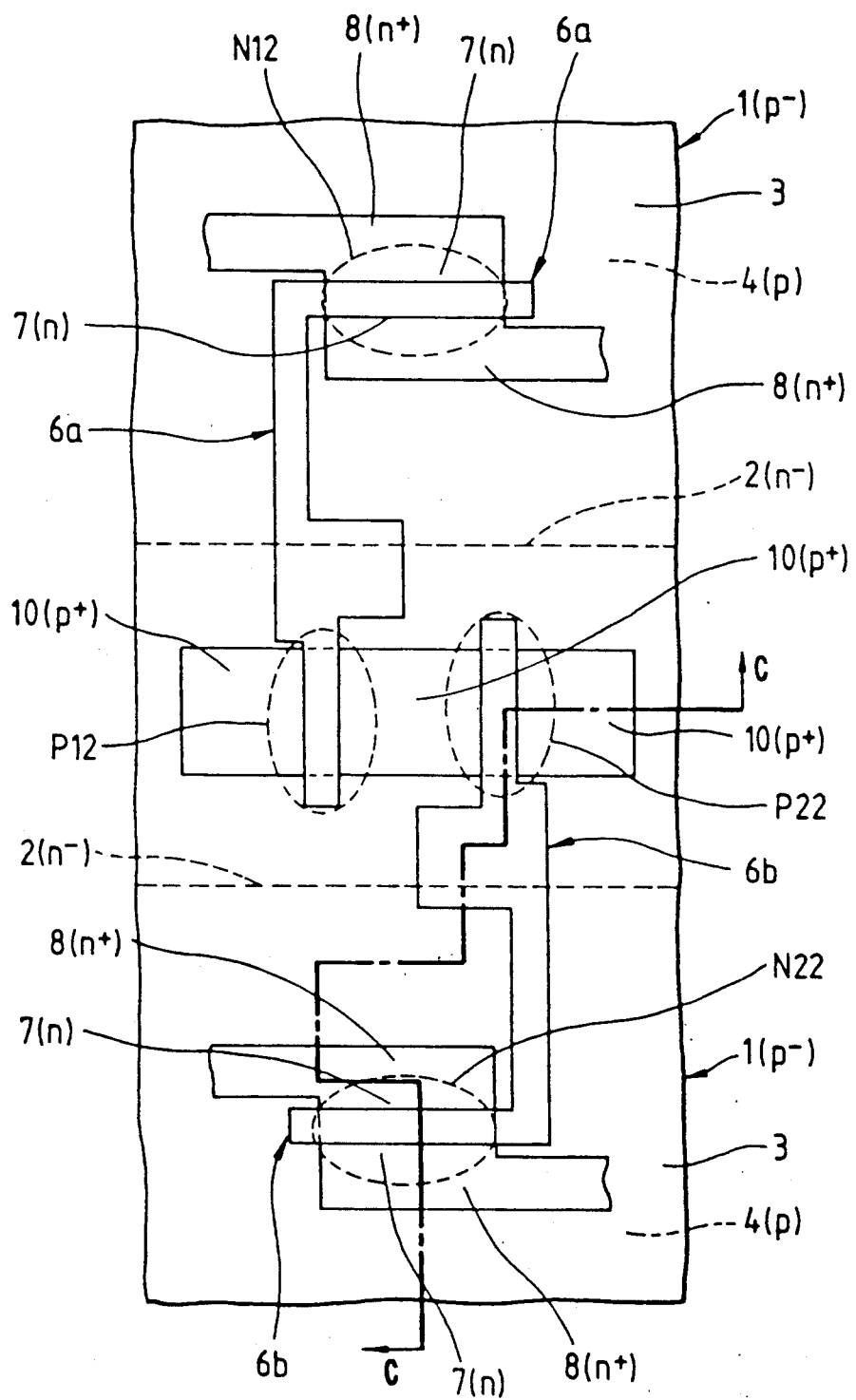
FIG. 5 is a plan view showing the cells of the decoder depicted in FIG. 2 with the pair of complementary address signal lines of the cells and underlying aluminum wiring removed therefrom.

FIG. 1 is an equivalent circuit diagram for explaining the outline of the circuit arrangement of the decoder of a micro ROM which is an embodiment of the present invention;

FIG. 2 is a plan view of cells for constructing the decoder shown in FIG. 1;

FIG. 3 is a sectional view taken along cutting-plane line A—A in FIG. 2;

FIG. 4 is a plan view showing the cells of the decoder depicted in FIG. 2 with the pair of complementary address signal lines of the cells removed therefrom; and FIG. 5 is a plan view showing the cells of the decoder depicted in FIG. 2 with the pair of complementary address signal lines and underlying aluminum wiring removed therefrom.

By the way, an interlayer insulator film is omitted from each of the plan views of FIGS. 2, 4 and 5 in order to facilitate understanding the construction of the cells.

Referring to FIG. 1, symbols A1, A2, A3 and A4 denote address input terminals to which address signals are applied. Symbols T1, T2, T3 and T4 indicate true lines (non-inverting signal lines), while symbols B1, B2, B3 and B4 indicate bar lines (inverting signal lines). By way of example, the true line T1 and the bar line B1 construct one pair of complementary address signal lines. The bar lines B1-B4 are respectively connected to the address input terminals A1-A4 through inverters IN1, IN2, IN3 and IN4. Symbols P11, P12, P13, P14, P21, P22, P23 and P24 denote P-channel type MISFETs, while symbols N11, N12, N13, N14, N21, N22, N23 and N24 denote N-channel type MISFETs. By way of example, the P-channel type MISFET P11 and the N-channel type MISFET N11 construct one cell which constitutes the circuit of the decoder. The P-channel type MISFETs P11-P24 have their source regions connected to a wiring line for a power source potential $V_{cc}$ (for example, 5 [V]), and have their drain regions connected to a decode signal line DC1 or DC2. In addition, each of the gate electrodes of the P-channel type MISFETs P11-P24 is connected to one of the true lines T1-T4 or one of the bar lines B1 - B4. Regarding the laterally adjoining ones of the N-channel type MISFETs N11-N24, a series connection is effected thereof by connecting the source region of one such MISFET and the drain region of the other MISFET thereby constructing a ground line G1 or G2 effected by the series connection of N11-N14 or N21-N24 which serves to discharge charges stored in a word line W1 or W2, respectively. The decode signal line DC1 as well as the ground line G1 is connected to the word line W1 through a word line driver D1 constructed of an inverter, while the decode signal line DC2 as well as the ground line G2 is connected to the word line W2 through a word line driver D2 constructed of an inverter. Data lines DL1, DL2 are extended intersecting the word lines W1, W2, and memory cells QM1, QM2, QM3 and QM4 constituting the micro ROM are arranged at the intersection parts between the word lines W1, W2 and the data lines DL1, DL2. Each of the memory cells QM1-QM4 is constructed of an N-channel type MISFET.

In reading out information from the memory cell QM1, the word line W1 and the data line DL1 are selected. In selecting the word line W1, the address input signal of low level (for example, 0 [V]) is applied to the address input terminal A1, that of high level (for example, 5 [V]) to the terminal A2, that of the low level to the terminal A3, and that of the high level to the terminal A4. These address input signals bring the potential of the decode signal line DC1 to the low level. Subsequently, the decode signal of the low level is inverted by the word line driver D1 constructed of the inverter, to maintain the potential of the word line W1 at the high level. Besides, in selecting the data line DL1, a precharge signal $0_{pc1}$ is applied to the gate electrode of a precharging N-channel type MISFET $Q_{pc1}$ so as to turn "on" this MISFET $Q_{pc1}$, whereby the data line DL1 is selected.

The decoder of the micro ROM thus constructed has its circuit arrangement determined in such a way that the gate electrodes (input terminals) of the MISFETs P11-P14, P21-P24, N11-N14 and N21-N24 constituting the cells of the decoder are connected to either the true lines T1-T4 or the bar lines B1-B4.

Next, the construction of the cells of the decoder in this embodiment will be described with reference to FIGS. 2 thru 5. These figures show the cell configured of the P-channel type MISFET P12 and N-channel type MISFET N12 and the cell configured of the P-channel type MISFET P22 and N-channel type MISFET N22 illustrated in the equivalent circuit diagram of FIG. 1. As shown in FIG. 4, the P-channel type MISFET P12 and the N-channel type MISFET N12 constitute one cell CELL1 of the decoder, while the P-channel type MISFET P22 and the N-channel type MISFET N22 constitute the other cell CELL2. As shown in FIGS. 2 thru 5, the P-channel type MISFETs P12 and P22 are provided in an $n^-$-type well region 2 formed within a $p^-$-type semiconductor substrate 1, and the N-channel type MISFETs N12 and N22 are constructed on the principal surface of the semiconductor substrate 1.

Numeral 3 designates a field insulator film made of a silicon oxide film, and numeral 4 designates a p-type channel stopper region. The N-channel type MISFET N12 or N22 is configured of a gate insulator film 5 which is made of a silicon oxide film, a gate electrode 6a or 6b which is made of a double-layer film with a tungsten silicide (WSi$_2$) film stacked on a polycrystalline silicon film by way of example, n-type semiconductor regions 7 which form parts of a source region and a drain region, and n$^+$-type semiconductor regions 8 which form the source and drain regions integrally with the n-type semiconductor regions 7. These n-type semiconductor regions 7 are provided under the side parts (end sides) of the gate electrode 6a or 6b. Side walls 9 made of a silicon oxide film are provided on the side parts (end sides) of the gate electrode 6a or 6b. The N-channel type MISFET N12 or N22 has an LDD (lightly doped drain) structure. On the other hand, the P-channel type MISFET P12 or P22 is configured of a gate insulator film 5, a gate electrode 6a or 6b, and p$^+$-type semiconductor regions 10 which form a source region and a drain region. Besides, as shown in FIG. 5, the gate electrodes 6a of the P-channel type MISFET P12 and the N-channel type MISFET N12 are unitarily formed of the same conductor layer provided by an identical manufacturing step. Likewise, the gate electrodes 6b of the P-channel type MISFET P22 and the N-channel type MISFET N22 are unitarily formed.

Further, as shown in FIG. 2, p$^+$-type semiconductor regions 10 located between the gate electrode 6a and the gate electrode 6b is shared as the source regions by the P-channel type MISFETs P12 and P22. That is, the source regions of the two P-channel MISFETs P12 and P22 are actually formed of a single region, whereby the density of integration of the semiconductor integrated circuit device is raised. A wiring line 12A for feeding the power source potential V$_{cc}$ (for example, 5 [V]) is connected through a contact hole 13 to the aforementioned p$^+$-type semiconductor region 10 lying between the gate electrodes 6a and 6b. The wiring line 12A is made of a first level aluminum film. The cells CELL1 and CELL2 are laid out symmetrically with respect to a connection location on the p$^+$-type semiconductor region 10 corresponding to the electrical connection (connect hole) of the wiring line 12A with the common source region 10. A decode signal line 12B (corresponding to the line DC1 in FIG. 1) made of the first-layer aluminum film is connected through a contact hole 13 to the p$^+$-type semiconductor region 10 which is the drain region of the P-channel type MISFET P12. Likewise, a decode signal line 12B (corresponding to the line DC2 in FIG. 1) is connected to the p$^+$-type semiconductor region 10 which is the drain region of the P-channel type MISFET P22. A junction relay film (intermediate conductor film) 12C made of the first-level aluminum film is connected through a contact hole 13 to each of the gate electrode 6a of the cell CELL1 and the gate electrode 6b of the cell CELL2.

A first-level passivation film 11 made of, for example, a silicon oxide film is interposed between the gate electrodes 6a, 6b and the wiring line 12A, decode signal line 12B and junction relay film 12C. In addition, a second-level passivation film 14 which is constructed by stacking, for example, a silicon oxide film and a phosphosilicate glass (PSG) film is provided on the wiring line 12A, decode signal line 12B and junction relay film 12C.

This passivation film 14 is overlaid with the true line T2 and the bar line B2 which are made of a second-level aluminum film and which are extended substantially in parallel with each other. Here, the junction relay film 12C has an L-shaped plan pattern as shown in FIG. 4. It is connected to the gate electrode 6a or 6b, and it is extended so as to be directly (orthogonally) under regions where the true line T2 and bar line B2 are to be respectively formed. As shown in FIG. 2, in the cell CELL1, that part of the passivation film 14 at which the junction relay film 12C and the true line T2 overlap is selectively removed to form a contact hole 15A, through which the true line T2 is connected to the junction relay film 12C. Owing to this junction relay film 12C, the true line T2 is electrically connected to the common gate electrode 6a of the P-channel type MISFET P12 and N-channel type MISFET N12. On the other hand, in the cell CELL2, that part of the passivation film 14 at which the junction relay film 12C and the bar line B2 overlap is formed with a contact hole 15B, through which the bar line B2 is connected to the junction relay film 12C. Owing to this junction relay film 12C, the bar line B2 is electrically connected to the common gate electrode 6b of the P-channel type MISFET P22 and N-channel type MISFET N22. Here, however, if the contact hole 15A in the cell CELL1 is formed in the part of the passivation film 14 where the junction relay film 12C and the bar line B2 overlap, not in the part where the junction relay film 12C and the true line T2 overlap, then the gate electrode 6a will be connected to the bar line B2. Likewise, if the contact hole 15B in the cell CELL2 is formed in the part of the passivation film 14 where the junction relay film 12C and the true line T2 overlap, not in the part where the junction relay film 12C and the bar line B2 overlap, then the gate electrode 6b will be connected to the true line T2.

In this manner, the conductor layer members 12C which extend to the regions for forming (or to be formed) the complementary address signal lines (true line and bar line) are connected to the gate electrodes (input terminals) of the MISFETs (selector switch elements) which constitute the circuit of the decoder. Therefore the logic arrangement of the decoder, can be determined in accordance with whether or not the contact holes are formed in the interlayer insulator film overlying the conductor layer members 12C.

Next, a method of manufacturing the semiconductor integrated circuit device of this embodiment will be described with reference to FIGS. 9 thru 11, as well as FIGS. 2 thru 5 referred to in the description of the construction of the cells of the decoder.

First, as shown in FIG. 9, an n-type impurity (for example, phosphorus) is diffused into a semiconductor substrate 1 made of p$^-$-type single-crystal silicon, thereby to form an n$^-$-type well region 2. Thereafter, a p-type impurity (for example, boron) is introduced by ion implantation into the principal surface of the semiconductor substrate 1 outside the regions where an N-channel type MISFET N22 and a P-channel type MISFET P22 are to be formed. Further, using an oxidation-impermeable mask (of, for example, Si$_3$N$_4$) not shown, the selected area of the principal surface of the semiconductor substrate 1 is thermally oxidized. Thus, a field insulator film 3 made of a silicon oxide film is formed. On this occasion, the p-type impurity introduced into the principal surface of the semiconductor substrate 1 is subjected to drive-in diffusion by heat at the thermal oxidation step, so that a p-type channel stopper region 4 is also formed. Subsequently, the oxidation-impermeable mask not shown is removed, and the whole front surface of the resultant semiconductor substrate 1 is thermally oxidized, whereby gate insulator films 5 made of silicon oxide are formed.

Subsequently, as shown in FIG. 10, a polycrystalline silicon film is deposited on the semiconductor substrate 1 by, for example, CVD and is patterned by conventional photolithography and etching, thereby to form the gate electrodes 6b of the MISFETs N22 and P22. Further, using the gate electrode 6b of the MISFET N22 as a mask for introducing an impurity, the n-type impurity (for example., phosphorus) is introduced by ion implantation into the principal surface of the semiconductor substrate 1, whereby n-type semiconductor regions 7 are formed under the side walls of the gate electrode 6b.

Further, using the gate electrode 6b of the MISFET P22 as a mask, a p-type impurity (for example, boron) is introduced by ion implantation, whereby p+-type semiconductor regions 10 are formed in the n−-type well region 2. Further, side walls 9 made of silicon oxide are formed on the side walls (end sides) of the gate electrodes 6b by well-known techniques. Using the side walls 9 of the N-channel MISFET N22 as a mask, an n-type impurity (for example, arsenic) is introduced into the-principal surface of the semiconductor substrate 1, thereby to form n+-type semiconductor regions 8.

A sectional view shown in FIG. 10 is taken along cutting-plane line C—C indicated in FIG. 5. The gate electrode 6b of the-P-channel type MISFET P22 and the gate electrode 6b of the N-channel type MISFET N22 are unitarily patterned as shown in FIG. 5.

Figure 11:
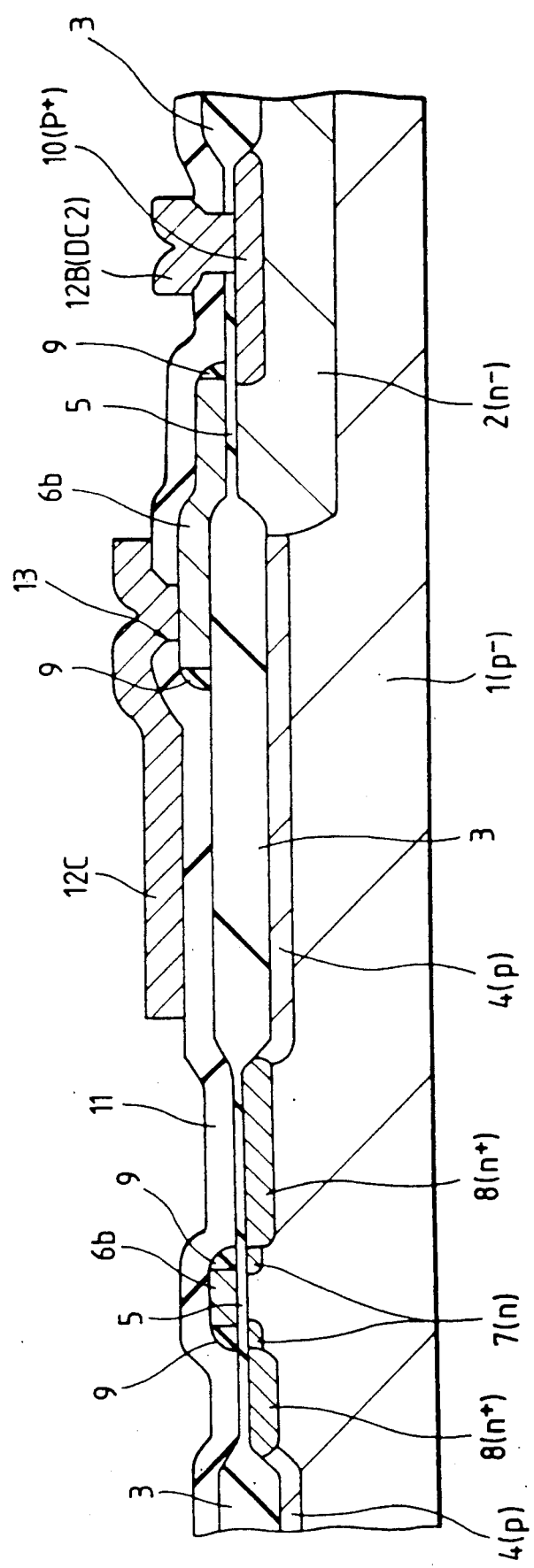

Subsequently, as shown in FIG. 11, a passivation film 11 made of a silicon oxide film is formed by, for example, CVD. Thereafter, those parts of the passivation film 11 which overlie the gate electrode 6b of the P-channel type MISFET P22 and the p+-type semiconductor region 10 for forming the common source region of P-channel type MISFETs P12 and P22 are selectively removed to form contact holes 13.

Subsequently, an aluminum film of first layer is formed on the passivation film 11 by, for example, sputtering and is patterned to form a wiring line 12 for feeding a power source potential $V_{cc}$, decode signal lines DC1 and DC2, and junction relay film members 12C as shown in FIG. 4 (the plan view). FIG. 11 corresponds to a sectional view taken along cutting-plane line B—B in FIG. 4. The junction relay film members 12C are formed in a pattern in which they can be respectively connected to gate electrodes 6a and 6b and in which they can be connected to both a true line T2 and a bar line B2. At the next step, as shown in FIG. 3, a passivation film 14 of second layer is formed in such a way that a silicon oxide film, a PSG film and a silicon oxide film are successively stacked from below by, for example, ordinary CVD or plasma CVD. Next, as shown in FIG. 2, a contact hole 15A and a contact hole 15B are respectively formed in the part of the film 14 in a cell CELL1 where the junction relay film 12C and the true line T2 overlap and the part in a cell CELL2 where the junction relay film 12C and the bar line B2 overlap. The contact holes 15A and 15B are formed in such a way that the passivation film 14 is selectively removed by dry etching which employs a mask made of a resist film. The mask made of the resist film is removed after the contact holes 15A and 15B have been formed. After the formation of the contact holes 15A and 15B, an aluminum film of second layer is stacked on the passivation film 14 and is patterned by dry etching which employs a mask made of a resist film, whereby the true line T2 and the bar line B2 are formed.

Here, when the contact holes 15A and 15B are to be formed, cell patterns for designing the layout of the contact holes 15A and 15B are determined beforehand as illustrated in FIG. 6 and FIGS. 7a–7d.

FIG. 6 is a plan view of the cells of the decoder for designing the layout of the contact holes 15A and 15B which serve to connect the respective gate electrodes 6a and 6b of the cells (CELL1, CELL2) and the true line T2 or the bar line B2; and FIGS. 7a thru 7d are layout diagrams of the contact holes 15A and 15B for connecting the cells (CELL1, CELL2) of the decoder and the true line T2 or the bar line B2.

Figure 7A:
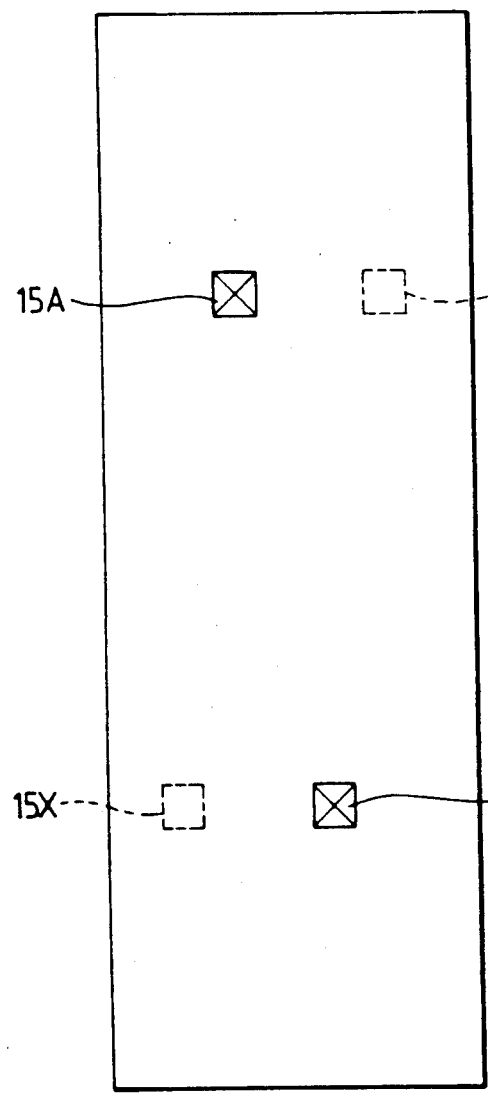
Figure 7B:
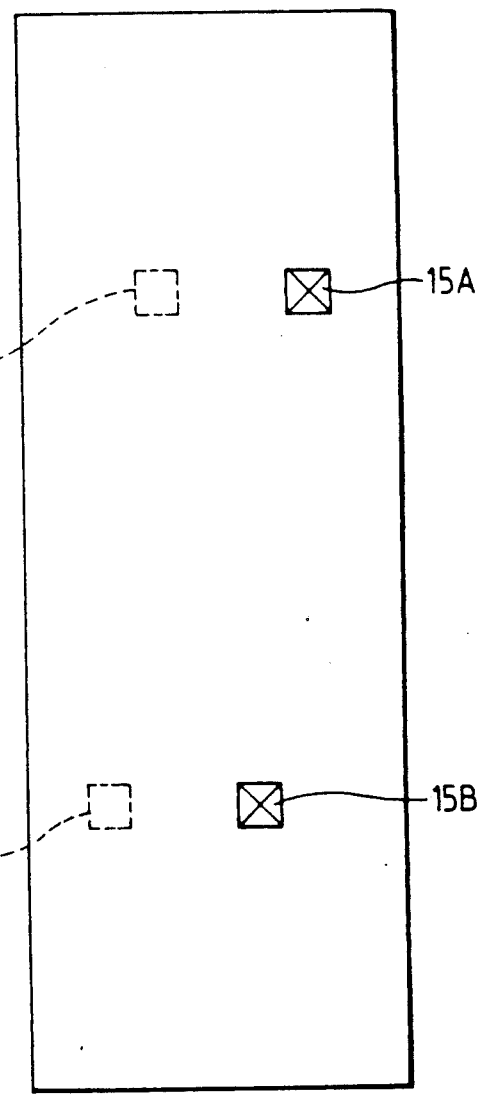
Figure 8B:
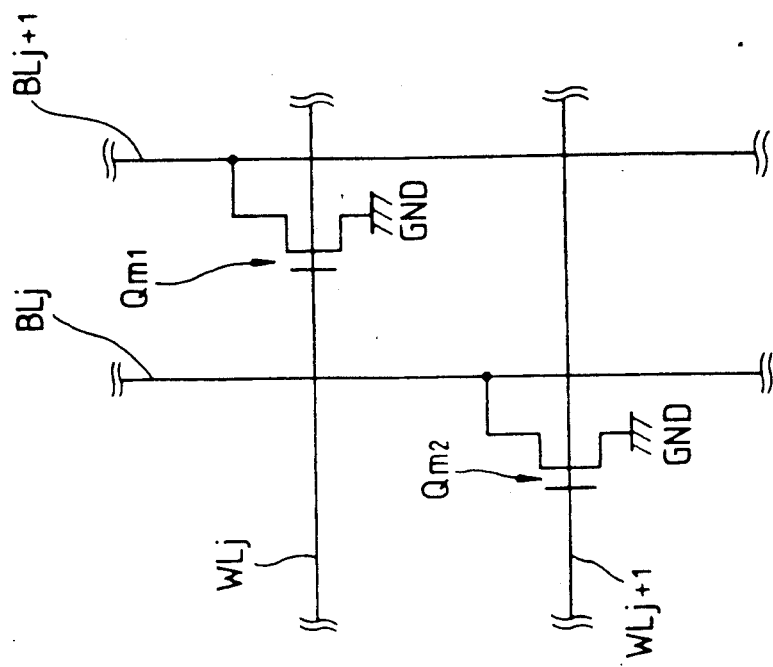
FIG. 8B is an equivalent circuit diagram of the memory cells depicted in FIG. 8A FIGS. 9 thru 11 are sectional views of essential portions showing the cells constituting of the circuit of the decoder of the micro ROM of the present invention in the order of the manufacturing steps thereof.
Figure 8A:
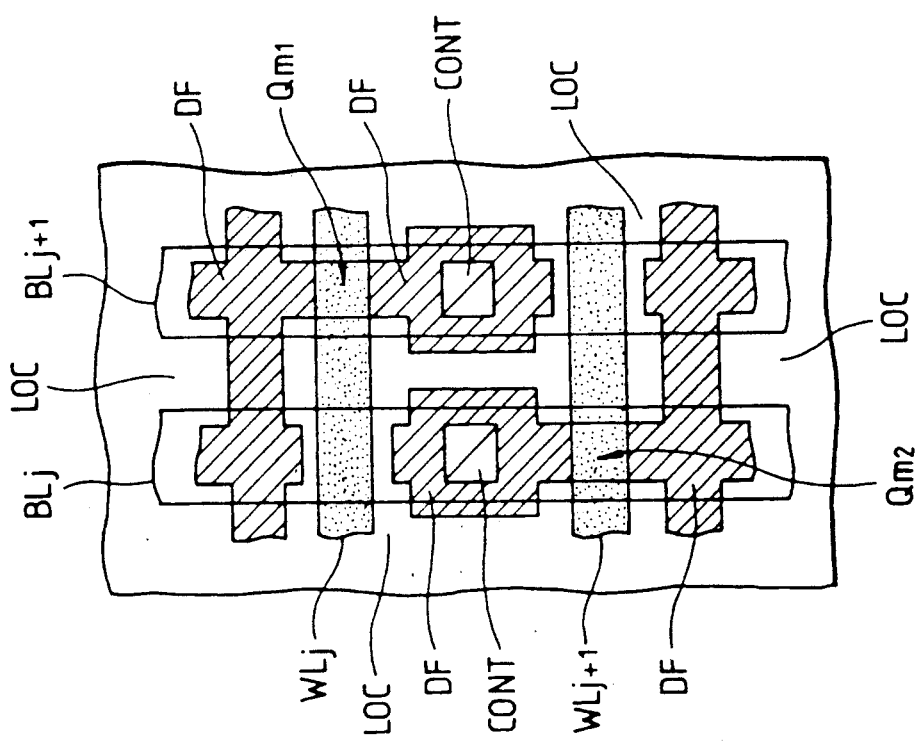
FIG. 8A is a plan view of the essential portions of memory cells in which the information of a ROM has been written by a diffusion layer mask system.

As shown in FIG. 6, the layout of the contact holes 15A and 15B is designed by handling a domain 100 enclosed with a two-dot chain line as one unit. The two cells (CELL1, CELL2) shown in FIG. 4 are included in the domain 100. Incidentally, since the plan view of FIG. 6 shows a state before the determination of the layout of the contact holes 15A and 15B, these contact holes are not depicted. In addition, contact holes 15X indicated by broken lines in FIGS. 7a–7d are phantom contact holes illustrated for clarifying the arrangement of the contact holes 15A and 15B which are indicated by solid lines and which are actually formed. The layout of the contact holes 15A and 15B can be readily designed in such a way that the layout diagram of any of FIGS. 7a14 7d is exactly placed on the domain 100 in FIG. 6. More specifically, in case of connecting the gate electrode 6a of the cell CELL1 to the bar line B2 and the gate electrode 6b of the cell CELL2 to the true line T2, the layout diagram of FIG. 7a is exactly placed on the domain 100 in FIG. 6, whereby the layout of the contact holes 15A and 15B can be easily designed. Besides, in case of connecting both the gate electrode 6a of the cell CELL1 and the gate electrode 6b of the cell CELL2 to the true line T2, the layout of the contact holes 15A and 15B is designed by placing the layout diagram of FIG. 7b on the domain 100 in FIG. 6. Further, in case of connecting both the gate electrode 6a of the cell CELL1 and the gate electrode 6b of the cell CELL2 to the bar line B2, the layout of the contact holes 15A and 15b is designed by placing the layout diagram of FIG. 7c on the domain 100 in FIG. 6. Still further, in case of connecting the gate electrode 6a of the cell CELL1 to the true line T2 and the gate electrode 6b of the cell CELL2 to the bar line B2, the layout of the contact holes 15A and 15B is designed by placing the layout diagram of FIG. 7d on the domain 100 in FIG. 6.

In this embodiment, steps after the formation of the contact holes 15A and 15B consist only of the step of forming the second-layer aluminum film on the passivation film 14, the step of coating the aluminum film with the resist film, the steps of baking the resist film, exposing it to light, developing it and post-baking it, the step of patterning the aluminum film by etching so as to form the true line T2 and the bar line B2 of the pair of complementary address signal lines, the step of removing the resist film having been used as the mask, and the step of forming a final passivation film on the true line T2 and the bar line B2. The final passivation film is formed in such a way that a silicon oxide film, a silicon nitride film or the likes are stacked by, for example, plasma CVD.

Although, in this embodiment, the true line T2 and the bar line B2 are formed of the second-layer aluminum film, this aspect is not an absolute condition. The true line T2 and the bar line B2 may well be formed of the first-layer aluminum film, namely, the conductor film which directly overlies the gate electrodes 6a and 6b. In this case, the wiring line 12 for feeding the power source potential $V_{cc}$ to the source regions (p+-type semiconductor regions 10) of the P-channel MISFETs, the decode signal lines 12B (DC), and the junction relay film portions 12C are formed of the second-layer aluminum film. Moreover, the junction film 12C can be dispensed with in the following way: The pattern of the gate electrode 6a or 6b itself is extended from under the true line T2 to under the bar line B2 or from under the bar line B2 to under the true line T2 beforehand, whereby the true line T2 or bar line B2 formed of the first-layer aluminum film can be directly connected to the gate electrode 6a or 6b through the contact hole 13.

As described above, according to a method of manufacturing a semiconductor integrated circuit device in one embodiment of the present invention, selector switch elements (configured of P-channel type MISFETs and N-channel type MISFETs in this embodiment) which select decode signal lines in accordance with address signals received from pairs of complementary address signal lines, each pair including a true line T2 and a bar line B2, are formed in the region of a semiconductor substrate 1 for forming a decoder; subsequently, members of an intermediate conductor film 12C are provided so as to be connected to the input terminals of the selector switch elements and to be extended under regions in which the true line and the bar line are to be formed; subsequently, an interlayer insulator film 14 is formed on the intermediate conductor film 12C; thereafter, contact holes 15A, 15B are formed in the parts of the interlayer insulator film 14 overlaying the intermediate conductor film members 12C; and subsequently, either the true line T2 or the bar line B2 of the pair of complementary address signal lines is electrically connected to the intermediate conductor film members 12C through the contact holes 15A, 15B, thereby to electrically connect either the true line T2 o the bar line B2 to the input terminals (the gate electrodes 6a and 6b in this embodiment) for the selector switch elements; whereby the circuit arrangement of the decoder is determined by the above step of forming the contact holes 15A, 15B. Therefore, a production process since the determination of the circuit arrangement of the decoder till the completion of the semiconductor integrated circuit device can be shortened without adding to any step.

Moreover, the source regions of the P-channel type MISFETs P12, P22 of the two cells of the decoder are formed of a single common p+-type semiconductor region 10. Therefore, the area of the cells can be made smaller to heighten the density of integration of the semiconductor integrated circuit.

Figure 12:
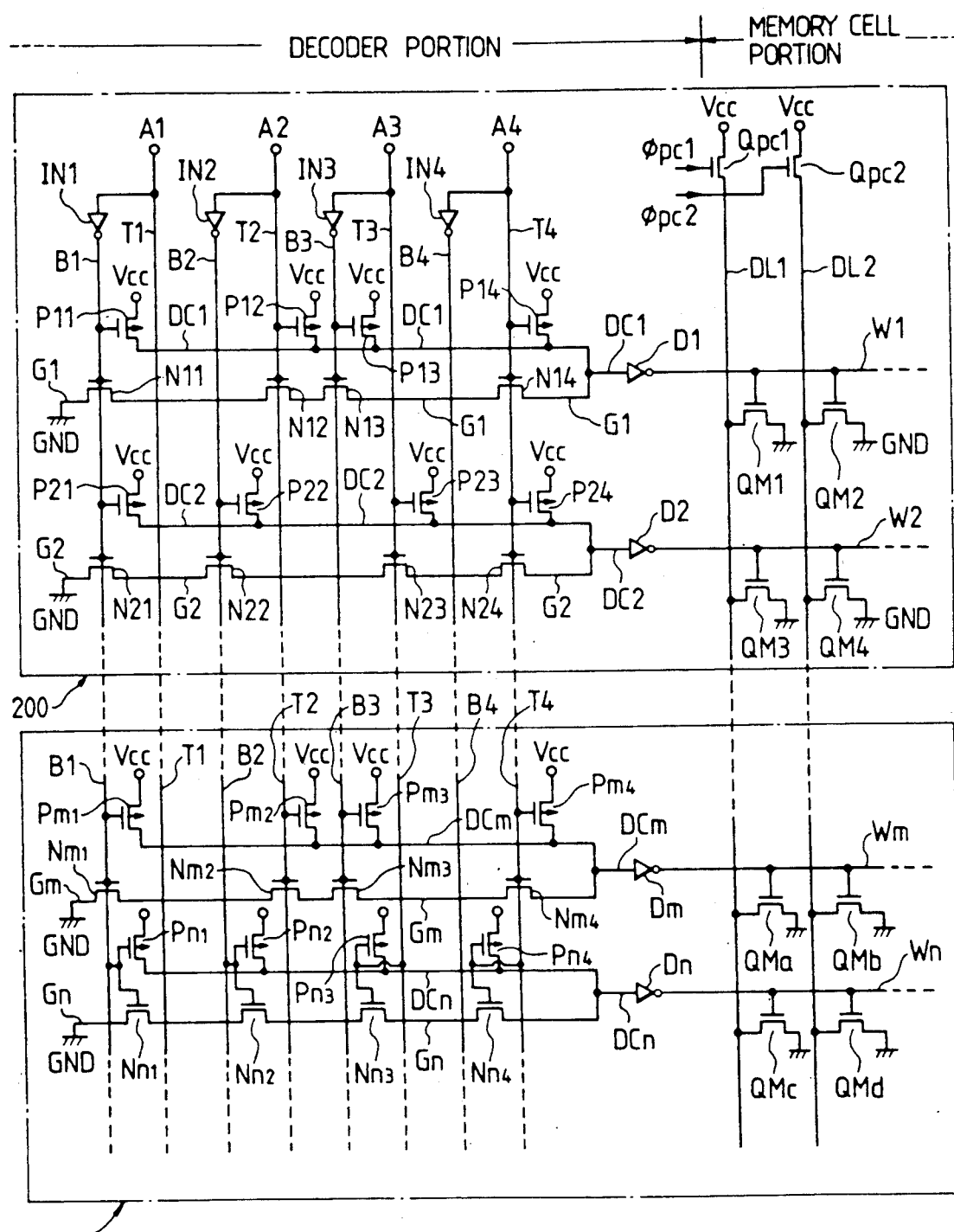
FIG. 12 is an equivalent circuit diagram of a micro ROM which is a modified embodiment of the present invention.

FIG. 12 shows a circuit diagram of a semiconductor integrated circuit device having a micro ROM in a modified embodiment of the present invention.

As illustrated in FIG. 12, a decoder portion and a memory cell portion in a domain enclosed with a dot-and-dash line 200 are substantially the same as those depicted in FIG. 1. The point of difference of this modification is that a decoder portion (redundant decoder) and a memory cell portion (redundant memory cells) in a domain enclosed with a dot-and-dash line 300 are additionally provided. In the redundant decoder, the drains of P-channel type MISFETs $P_{m1}$-$P_{m4}$ and $P_{n1}$-$P_{n4}$ are respectively connected to decode signal lines $DC_m$ and $DC_n$.

Besides, N-channel type MISFETs $N_{m1}$-$N_{m4}$ and $N_{n1}N_{n4}$ are respectively connected in series, thereby to form discharge lines $G_m$ and $G_n$. Further, a word line $W_m$ is connected to the decode signal line $DC_m$ through a driver circuit $D_m$ constructed of an inverter, while a word line $W_n$ is similarly connected to the decode signal line $DC_n$ through a driver circuit $D_n$ constructed of an inverter. To be noteworthy here is that, when the memory cell QM1 disposed at the intersection part between the word line W1 and the data line DL1 has become a defective bit due to, for example, any error in the production process, it can be remedied by the use of the redundant decoder circuit ($P_{m1}$-$P_{m4}$) and the redundant memory cells ($QM_a$, $QM_b$). The reason is as stated below: The MISFETs $P_{m1}$-$P_{m4}$ and $N_{m1}$-$N_{m4}$ constituting the redundant decoder are formed by substantially the same manufacturing steps as those of the MISFETs P11-P14 and N11-N14 constituting the decoder shown in FIG. 1. At the step of forming the contact holes 15A and 15B stated before, therefore, the arrangement of the redundant decoder circuit is made identical to that of the decoder circuit (P11-P14, N11-N14) which serves to select the word line W1 connected to the memory cell QM1 having become the defective bit. Thus, the decoder portion and memory cell portion of the micro ROM can be formed as designed.

A method of manufacturing the redundant memory cells ($QM_a$-$QM_d$) in this case will be briefly described with reference to FIGS. 13 thru 15.

As shown in FIG. 13, a field insulator film 13, a P-type channel stopper region 4, a gate insulator film 5, gate electrodes 6C ($W_m$, $W_n$), n-type semiconductor regions 7, side walls 9 and n+-type semiconductor regions 8 are formed on the principal surface of a p−-type semiconductor substrate 1 by steps similar to those illustrated in FIGS. 9 and 10. The memory cells $QM_a$ and $QM_c$ are respectively constructed of N-channel type MISFETs whose gate electrodes function as the word lines $W_m$, $W_n$ (6C) and whose source and drain regions are formed of the n-type semiconductor regions 7 and n+-type semiconductor regions 8. The n+-type semiconductor region 8 lying between the word lines $W_m$ and $W_n$ serves as the common source regions of the memory cells $QM_a$ and $QM_c$, and is connected to a ground potential GND (0 [V]). The gate electrodes 6C are formed by substantially the same manufacturing step as that of the gate electrode 6b of the N-channel type MISFET N22 illustrated in FIGS. 2 and 10.

Subsequently, as shown in FIG. 14, a passivation film 11 made of a silicon oxide film is formed on the whole front surface of the semiconductor substrate 1. Thereafter, the parts of the passivation film 11 overlying the n+-type semiconductor regions 8 to serve as the drain regions of the memory cells $QM_a$ and $QM_c$ are selectively removed, thereby to form contact holes 13C. Next, an aluminum film of first layer is formed on the passivation film 11 by, for example, sputtering and is patterned, thereby to form members of an intermediate conductor film 12C. The intermediate conductor film members 12C are electrically connected to the respective n+-type semiconductor regions 8 to serve as the drain regions, through the corresponding contact holes 13C. The passivation film 11 and the intermediate conductor film 12C are formed by substantially the same manufacturing steps as those of the passivation film 11 and the intermediate conductor film 12C illustrated in FIG. 11.

Figure 15:
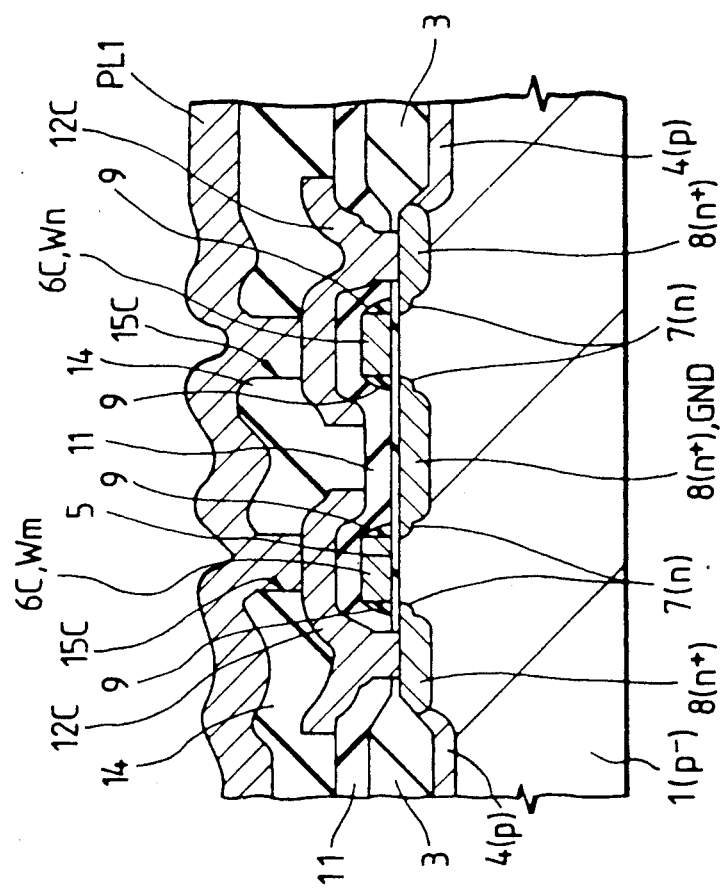

Subsequently, as shown in FIG. 15, a passivation film 14 of second layer is formed by stacking a silicon oxide film, a PSG film and a silicon oxide film in succession. Thereafter, contact holes 15C are formed by removing the selected parts of the passivation film 14 on the intermeadiate conductor film 12C. Next, an aluminum film of second layer is formed on the passivation film 14 and is patterned, thereby to form a data line DL1 which is electrically connected to the intermediate conductor film 12C. The passivation film 14, contact holes 15C and data line DL1 are formed by substantially the same manufacturing steps as those of the passivation film 14, contact holes 15B and the true line T2 as well as the bar line B2, illustrated in FIG. 3. In this manner, the memory cells $QM_a$ and $QM_c$ to serve as the redundant bits are permitted to be electrically connected to the bit line DL1 through the contact holes 15C in such a way that the drain regions thereof are lead out upwards by the intermediate conductor film members 12C. In addition, whether or not information items are written into the memory cells of the micro ROM (how the instruction program of the micro ROM is set) is determined, depending upon whether or not the contact holes 15C are formed. It is accordingly possible to determine the constitution of the instruction program of the micro ROM by means of the step of forming the contact holes 15C. Besides, as illustrated in FIG. 3, the circuit arrangement of the decoder is determined by the step of forming the contact holes 15B (the same step as that of forming the contact holes 15C). Thus, the arrangement of the circuit of the decoder and the constitution of the program of the micro ROM can be determined by the step of forming the contact holes 15B and 15C. Therefore, even when the defective bit has developed, the semiconductor integrated circuit device having the micro ROM as designed can be manufactured by carrying out the method again from the step of forming the interlayer insulator film 14. Accordingly, the TAT can be shortened.

Although, in the above, the present invention has been concretely described in conjunction with embodiments, it is needless to say that the present invention is not restricted to the foregoing embodiments, but that it can be variously altered within a scope not departing from the purport thereof.

An effect which is attained by a typical aspect of performance of the present invention is briefly described as follows:

The circuit arrangement of a decoder is determined by the step of forming contact holes which connect P-channel type MISFETs for constructing the cells of the decoder and either true lines or bar lines, so that a production process since the determination of the circuit arrangement of the decoder till the completion of a semiconductor integrated circuit device can be shortened without adding to any step.

What is claimed is:

1. A semiconductor device having a decoder circuit for a memory, said semiconductor device comprising:
   a semiconductor substrate;
   an address line having a pair of complementary address signal lines which are disposed over said semiconductor substrate;
   a cell which includes a decoder circuit for a memory and which is comprised of a first MISFET of a first conductivity type and a second MISFET of a second conductivity type, said cell being formed on said semiconductor substrate; and
   a conductor layer which is connected to gate electrodes of said first and second MISFETs and which is extended so as to underlie a region where said pair of complementary address signal lines are respectively to be formed, wherein said conductor layer is electrically connected to one of said complementary address signal lines.

2. A semiconductor device according to claim 1, wherein said memory comprises a microprogram storing ROM, said semiconductor device further comprising:
   a decoder signal line which is connected to a drain region of said first MISFET and which is coupled to a word line of said memory.

3. A semiconductor device according to claim 2, wherein said cell includes means for selecting said decoder signal line in accordance with address signals received from said pair of complementary address signal lines.

4. A semiconductor device according to claim 3, wherein a source region of said first MISFET is connected to a first wiring line which supplies an operating potential of said decoder circuit, and wherein said conductor layer, said first wiring line, and said decoder signal line are formed by a first-level aluminum film.

5. A semiconductor device according to claim 4, wherein said address line is formed by a second-level aluminum film.

6. A semiconductor device according to claim 1, wherein said conductor layer is formed by a first-level aluminum film, and said address line is formed by a second-level aluminum film.

7. A semiconductor device according to claim 1, wherein said first MISFET is a p-channel MISFET, and said second MISFET is an n-channel MISFET.

8. A semiconductor device having a decoder circuit for a memory, said semiconductor device comprising:
   a semiconductor substrate;
   an address line having a pair of complementary address signal lines which are disposed over said semiconductor substrate;
   first and second cells which are correspondingly associated with said address line include a decoder circuit for a memory and are formed on said semiconductor substrate, each of said first and second cells being comprised of a first MISFET of a first conductivity type and a second MISFET of a second conductivity type;
   a first wiring line which supplies an operating potential of said decoder circuit;
   a first semiconductor region serving to provide respective drain regions of said first MISFETs of said first and second cells and a source region common to said first MISFETs of both said first and second cells, wherein said first wiring line is electrically connected tot he common source region of said first semiconductor region, and wherein said first and second cells are laid out on said semiconductor substrate symmetrically with respect to the location of the electrical connection of said first wiring line and said first semiconductor region; and
   first and second conductor layers, each one thereof being electrically connected to gate electrodes of both the first and second MISFETs of a respective one of said first and second cells, each one of said first and second conductor layers being formed within an area on said semiconductor substrate for forming said first and second cells, respectively, each one of said first and second conductor layers being extended so as to underlie a respective region where said pair of complementary address signal lines are respectively to be formed and each of said conductor layers being connected to one of said complementary address signal lines.

9. A semiconductor device according to claim 8, wherein said first semiconductor region is of said first conductivity type and said first conductivity type is a P-type conductivity.

10. A semiconductor device according to claim 8, wherein said operating potential is 5 volts.

11. A semiconductor device according to claim 1, further comprising:
an insulator film being disposed on said conductor layer, said address line being disposed on said insulator film, wherein a contact hole is formed in the part of said insulator film where said conductor layer and said one of the complementary address signal lines overlap, and wherein said conductor layer is connected to said one of the complementary address signal lines through said contact hole.

12. A semiconductor device according to claim 11, wherein said conductor layer has an L-shaped plan pattern.

13. A semiconductor device according to claim 12, wherein said conductor layer has a section of said L-shaped plan pattern which extends in a direction perpendicular to the direction in which said address line extends, so as to effect overlapping of said conductor layer to said address line.

14. A semiconductor device according to claim 8, further comprising:
an insulator film being disposed on said conductor layer, said address line being disposed on said insulator film, wherein a contact hole is formed in the part of said insulator film where said conductor layer and said one of the complementary address signal lines overlap, and wherein said conductor layer is connected to said one of the complementary address signal lines through said contact hole.

15. A semiconductor device according to claim 14, wherein said conductor layer has an L-shaped plan pattern.

16. A semiconductor device according to claim 15, wherein said conductor layer has a section of said L-shaped plan pattern which extends in a direction perpendicular to the direction in which said address line extends, so as to effect overlapping of said conductor layer to said address line.

17. A semiconductor device comprising:
a semiconductor substrate;
a memory portion including a plurality of memory cells and perpendicularly arranged data lines and word lines, formed on said semiconductor substrate, each memory cell being coupled to an intersecting word and data line;
at least one address line having a pair of complementary address signal lines which are disposed over said semiconductor substrate;
decoder means, including a p-channel MISFET and an n-channel MISFET formed on said semiconductor substrate, for selecting a word line connected to a respective memory cell; and
a conductor layer which is connected to gate electrodes of said p-channel and n-channel MISFETs is extended so as to underlie a region where said pair of complementary address signal lines are respectively to be formed, wherein said conductor layer is electrically connected to one of said complementary address signal lines.

18. A semiconductor device according to claim 17, further comprising:
an insulator film being disposed on said conductor layer, said address line being disposed on said insulator film, wherein a contact hole is formed in the part of said insulator film where said conductor layer and said one of the complementary address signal lines overlap, and wherein said conductor layer is connected to said one of the complementary address signal lines through said contact hole.

19. A semiconductor device according to claim 18, wherein said conductor layer has an L-shaped plan pattern.

20. A semiconductor device according to claim 19, wherein said conductor layer has a section of said L-shaped plan pattern which extends in a direction perpendicular to the direction in which said address lien extends, so as to effect overlapping of said conductor layer to said address line.

21. A semiconductor device according to claim 17, wherein said memory portion comprises a microprogram storing ROM, said semiconductor device further comprising:
a decoder signal line which is connected to a drain region of said first MISFET and which is coupled to a work line of said memory portion.

22. A semiconductor device according to claim 21, wherein a source region of said first MISFET is connected to a first wiring line which supplies an operating potential of said decoder circuit, and wherein said conductor layer, said first wiring line, and said decoder signal line are formed by a first-level aluminum film.

23. A semiconductor device according to claim 22, wherein said address line is formed by a second-level aluminum film.

24. A semiconductor device according to claim 17, wherein said conductor layer is formed by a first-level aluminum film, and said address line is formed by a second-level aluminum film.

25. A semiconductor device according to claim 9, wherein said first and second conductor layers are formed by a first-level aluminum film, and said address line is formed by a second-level aluminum film.

26. A semiconductor device according to claim 17, wherein said decoder means includes at least one cell for each word line, each cell having a p-channel MISFET and an n-channel MISFET and each cell being associated with a respective address line and a corresponding conductor line.

27. A semiconductor device according to claim 1, wherein said decoder circuit includes at least one cell for each word line, each cell having a p-channel MISFET and an n-channel MISFET and each cell being associated with a respective address line and a corresponding conductor line.

* * * * *